US009230940B2

(12) United States Patent
Goodnow et al.

(10) Patent No.: US 9,230,940 B2
(45) Date of Patent: Jan. 5, 2016

(54) THREE-DIMENSIONAL CHIP STACK FOR SELF-POWERED INTEGRATED CIRCUIT

(71) Applicant: INTERNATIONAL BUSINESS MACHINES CORPORATION, Armonk, NY (US)

(72) Inventors: Kenneth J. Goodnow, Essex Junction, VT (US); Todd E. Leonard, Williston, VT (US); Stephen G. Shuma, Underhill, VT (US); Peter A. Twombly, Shelburne, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 43 days.

(21) Appl. No.: 14/026,597

(22) Filed: Sep. 13, 2013

(65) Prior Publication Data

US 2015/0077173 A1    Mar. 19, 2015

(51) Int. Cl.
| | |
|---|---|
| *H01L 23/52* | (2006.01) |
| *H01L 25/065* | (2006.01) |
| *H01L 31/042* | (2014.01) |
| *H01L 35/00* | (2006.01) |
| *H01M 12/00* | (2006.01) |
| *H01L 31/053* | (2014.01) |
| *H01L 23/00* | (2006.01) |

(52) U.S. Cl.
CPC .......... *H01L 25/0657* (2013.01); *H01L 31/042* (2013.01); *H01L 31/053* (2014.12); *H01L 35/00* (2013.01); *H01M 12/00* (2013.01); *H01L 24/13* (2013.01); *H01L 24/16* (2013.01); *H01L 2224/131* (2013.01); *H01L 2224/16145* (2013.01); *H01L 2225/06541* (2013.01)

(58) Field of Classification Search
CPC ................. H01L 25/0657; H01L 2225/06513; H01L 2225/06541; H01L 23/481; H01L 23/5389; H01L 25/167; H01L 2224/16145; H01L 2224/48145; H01L 2225/1058; H01L 27/0688
See application file for complete search history.

(56) References Cited

U.S. PATENT DOCUMENTS

| 7,623,365 | B2 * | 11/2009 | Jeddeloh ......................... 365/63 |
| 8,689,160 | B2 * | 4/2014 | Lin et al. ....................... 716/113 |
| 8,809,078 | B1 * | 8/2014 | Lau et al. ........................ 438/19 |
| 2008/0258259 | A1 * | 10/2008 | Osaka et al. .................. 257/532 |

(Continued)

FOREIGN PATENT DOCUMENTS

| CN | 101777565 | 7/2010 |
| KR | 100618903 | 8/2006 |

(Continued)

OTHER PUBLICATIONS

Wang et al., "Green Energy Harvesting Technology in 3D IC", IEEE 2010, pp. 5-8.

*Primary Examiner* — Bac Au
(74) *Attorney, Agent, or Firm* — David Cain; Andrew M. Calderon; Roberts Mlotkowski Safran & Cole, P.C.

(57) ABSTRACT

Structures and methods for self-powered devices are disclosed herein. Specifically, disclosed herein is a stacked, three-dimensional integrated circuit including a power generation die including a power source. The integrated circuit also includes a functional system die including one or more functional components that are powered by power generated by the power source. The power generation die and the functional system die are stacked in a three-dimensional structure.

10 Claims, 11 Drawing Sheets

(56) References Cited

U.S. PATENT DOCUMENTS

| | | |
|---|---|---|
| 2010/0176506 A1* | 7/2010 | Hsu et al. ............... 257/698 |
| 2011/0169554 A1 | 7/2011 | Keysar et al. |
| 2012/0019214 A1 | 1/2012 | Hussain |
| 2012/0118383 A1 | 5/2012 | Bedell et al. |
| 2013/0336082 A1* | 12/2013 | Khawshe et al. ........ 365/233.12 |
| 2014/0372772 A1* | 12/2014 | McKnight et al. ............ 713/300 |
| 2015/0003181 A1* | 1/2015 | Droege et al. ................ 365/226 |

FOREIGN PATENT DOCUMENTS

| | | |
|---|---|---|
| KR | 20120071360 | 7/2012 |
| WO | 03061095 | 7/2003 |

* cited by examiner

THREE-DIMENSIONAL CHIP STACK FOR SELF-POWERED INTEGRATED CIRCUIT

FIELD OF INVENTION

The invention relates to self-powered devices and, more particularly to self-powered integrated circuits.

BACKGROUND

Self-powered, portable devices typically rely on batteries to provide power. The batteries in these devices must be recharged or replaced periodically. Efforts to reduce the need for recharging and replacing batteries have included attempting to increase the power storage capacity of batteries and to lower the power consumption of the devices.

Some self-powered devices are integrated circuits and have all their components fabricated at the integrated circuit level. However, tying such devices to batteries or similar power sources is not suitable for some applications due the limitations of batteries.

SUMMARY

In an aspect of the invention there is a stacked three-dimensional integrated circuit including a power generation die including a power source. The integrated circuit further includes a functional system die including one or more functional components that are powered by power generated by the power source. The power generation die and the functional system die are stacked in a three-dimensional structure.

In an aspect of the invention there is a method for providing an integrated circuit. The method includes manufacturing a power generation die using first fabrication technology corresponding to components included in the power generation die. The method also includes manufacturing a power storage and control die using a second fabrication technology corresponding to components that are included in the power storage and control die. The method further includes manufacturing a functional system die using a third fabrication technology corresponding to components included in the functional system die. The method additionally includes assembling the power generation die, the power storage and control die, and the functional system die into a three-dimensional chip stack using an interconnect structure. Moreover, at least two of the first fabrication technology, the second fabrication technology, and the third fabrication technology may be different.

In an aspect of the invention there is a method for routing power in a stacked three-dimensional integrated circuit. The method includes receiving power generated on a first die by a power source. The method also includes routing the power to functional components on a second die. The method further includes, determining that an amount of power stored in storage devices is less than a predetermined threshold. The method additionally includes stopping the routing of the power to the functional components. Moreover, the method includes routing the power from the first die to the storage devices.

In another aspect of the invention, a design structure tangibly embodied in a machine readable storage medium for designing, manufacturing, or testing an integrated circuit is provided. The design structure comprises a three-dimensional integrated chip stack. In further embodiments, a hardware description language (HDL) design structure encoded on a machine-readable data storage medium comprises elements that when processed in a computer-aided design system generates a machine-executable representation of the three-dimensional integrated chip stack of the present invention. In still further embodiments, a method in a computer-aided design system is provided for generating a functional design model of the three-dimensional integrated chip stack of the present invention. The method comprises generating a functional representation of the structural elements of the three-dimensional integrated chip stack of the present invention.

BRIEF DESCRIPTION OF THE SEVERAL VIEWS OF THE DRAWINGS

The present invention is described in the detailed description that follows, in reference to the noted plurality of drawings by way of non-limiting examples of exemplary embodiments of the present invention.

DETAILED DESCRIPTION

The invention relates to self-powered devices and, more particularly to self-powered integrated circuits. According to aspects of the invention, there are stacked three-dimensional (3D) integrated circuits that function autonomously. That is, stacked 3D integrated circuits in accordance with aspects of the invention are self-contained systems that generate power, store the power, and use the power to operate components that perform the functions of the system without physical connection to a power source external to the integrated circuit. Embodiments in accordance with aspects of the invention have a power output capacity corresponding to the power requirements of the functional components such that the functions of the system can be powered solely by stored power accumulated from a power source included in the stacked 3D integrated circuits.

According to aspects of the invention, the components of the stacked 3D integrated circuits are located on separate integrated circuit dies. In embodiments, these dies include a first die having one or more power generation devices (e.g., power harvesting devices), a second die having a power storage device and management devices, and a third die having functional devices (e.g., sensors, processors, receivers, transmitters, and the like that implement the functionality of a particular device apart from power generation, management, and storage). The dies are electrically and mechanically connected using an interconnect structure including conductors that carry power between the dies. In embodiments, the interconnect structure includes at least one through-silicon-via connecting a power generation die and a power storage and control die, and at least one through-silicon-via connecting the power storage and control die and a functional system die.

Self-powered devices in accordance with aspects of the invention include different integrated circuit technologies on different dies, such that each die can be fabricated using technologies that are optimal for their respective components in terms of, for example, performance, cost, yield, robustness, etc. For example, the functional system die may include components, such as a processor, fabricated using a high-performance technology (e.g., a 22 nm CMOS process on a silicon-on-insulator wafer), while components of the power generation die (e.g., a MEMS) or the power storage and control die can be fabricated using more robust technologies (e.g., a 90 nm CMOS process on a bulk silicon wafer).

Figure 1:
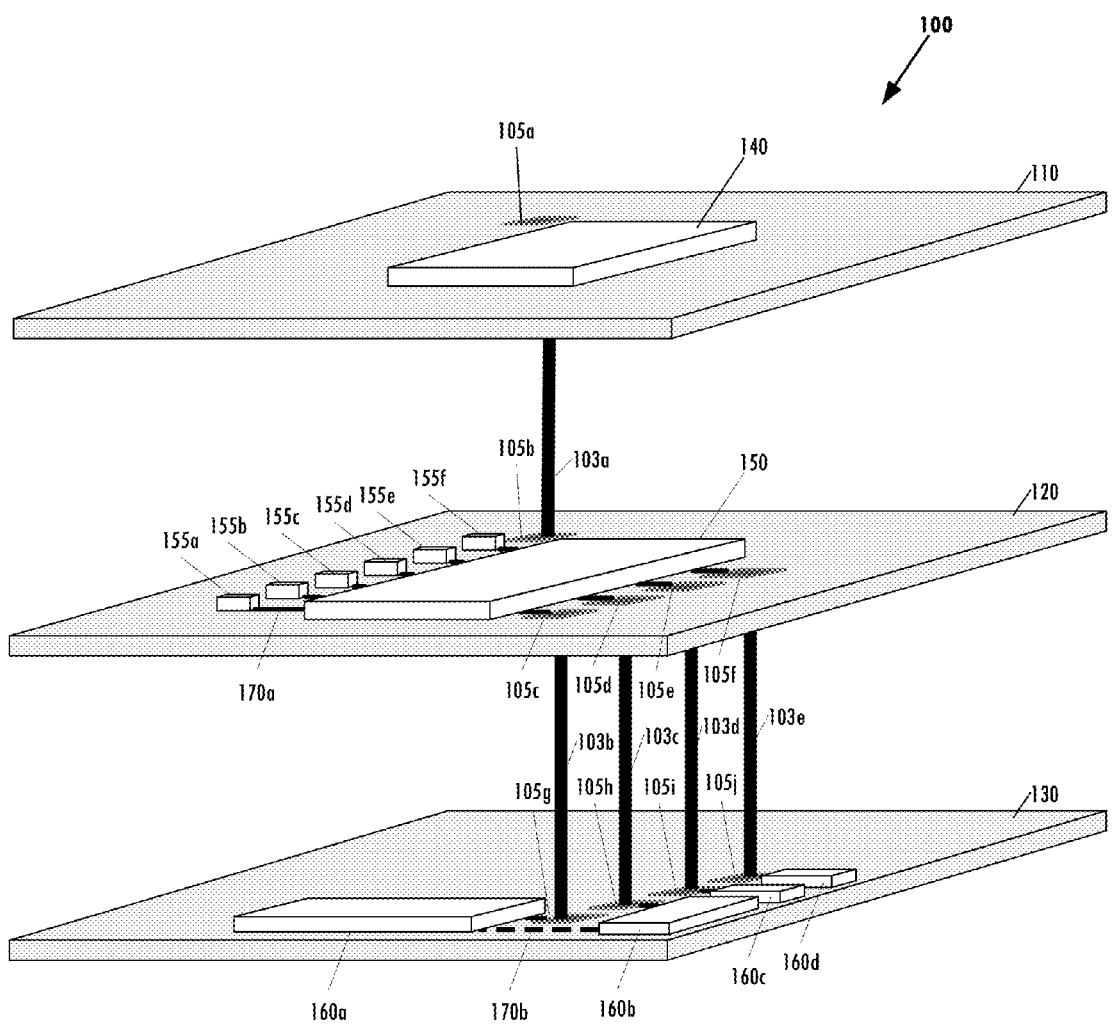
FIG. 1 shows an exemplary stacked three-dimensional (3D) integrated circuit in accordance with aspects of the present invention.

FIG. 1 shows an exemplary self-powered, integrated circuit 100 in accordance with aspects of the invention. A 3D integrated circuit (i.e., "3D-IC") is an integrated circuit having two or more layers of components that are integrated both vertically and horizontally into a single circuit. In accordance with aspects of the invention, integrated circuit 100 is an autonomous 3D-IC constructed of at least three stacked dies interconnected by conductors 103a . . . 103e (collectively referred to as "conductors 103") at interconnects 105a . . . 105j (collectively referred to as "interconnects 105"). In embodiments the stacked dies include, at least, a power generation die 110, a power storage and control die 120, and a functional system die 130. However, the invention is not limited to these three dies. Embodiments may include two dies and other embodiments can include four or more dies. For example, in embodiments including two dies, there may be one die including power generation and storage elements, and another die including power control and functional elements. Additionally, in embodiments including more than three dies, there may be a second power generation die, a second power storage die, and/or a second functional system die.

In accordance with aspects of the invention, dies 110, 120, and 130 are stacked in a particular order. In embodiments, the order of the dies in the stack is, from top-down, power generation die 110, power storage and control die 120, and functional system die 130. By using this arrangement, integrated circuit 100 provides physical clearance for operation of the power generation device (e.g., movement of elements of a MEMS or exposure to sunlight of a solar cell) and minimizes the lengths of electrical paths. However, embodiments of the invention are not limited to such arrangements and dies 110, 120, and 130 may be stacked in a different order and/or elements of dies 110, 120, and 130 may be placed on other dies and/or included on additional dies. For example, in embodiments power control circuit 150 may be placed on power generation die 110 and die 120 may be entirely comprised of storage devices 155.

According to aspects of the invention, conductors 103 and interconnects 105 provide an interconnection structure that electrically and mechanically interconnects dies 110, 120, and 130. Conductors 103 may be any suitable electrical conductive material for interconnecting layers of a 3D-IC at interconnects 105. Conductors 103 may carry electrical power and/or information, as the case may be for the various arrangement components included on different particular dies. In accordance with aspects of the invention, conductors 103 are a ball grid array (e.g., micro-ball grid arrays) or controlled collapse chip connections ("C4"). However, as will be understood by one of ordinary skill in the art, other connections between dies 110, 120, and 130 may be used (e.g., pins, pin arrays, solder connections, etc.). In accordance with aspects of the invention, the length of conductors 103 is minimized to avoid loss of power due to electrical resistance and parasitic capacitance.

According to aspects of the invention, interconnects 105 may be any suitable conduit for carrying power and/or information through dies 110, 120, and 130. In embodiments, some or all of interconnects 105 are through-silicon vias (TSV) that pass through a particular die from an upper surface of the die to a lower surface of the die. For example, as shown in FIG. 1, interconnect 105a is a through-silicon via of power generation die 110 that provides a minimal length conductive path through power generation die 110 such that the top surface of power generation die 110 can be electrically connected to interconnect 105b at the top surface of power storage and control die 120. Likewise, interconnects 105c . . . 105f of power storage and control die 120 may be through-silicon vias that provide minimal length conductive paths for electrically connecting the top surface of power storage and control die 120 to respective interconnects 105g . . . 105j at the top surface of functional system die 130.

In accordance with aspects of the invention, power generation die 110 generates (e.g., harvests) power that powers all operations of integrated circuit 100. In embodiments, power generation die 110 includes at least one power source 140. Power source 140 is a system that may use any suitable power technology or combination of power technologies that harvests power without a direct, physical connection (e.g., wired) to a power generation device external to integrated circuit 100. The selection of power source 140 can be based on the target environment of the complete device. For example, power source 140 can be constructed to generate electricity from heat, motion, electromagnetic radiation, chemical energy, etc. In some embodiments, power source 140 includes a photovoltaic power source, such as a solar cell, that harvests power from electromagnetic radiation (e.g., sunlight). In additional embodiments, power source 140 includes a MicroElectro-Mechanical System (MEMS) that harvests power from a vibrating member (e.g., beam) connected to piezoelectric material, from an electrostatic comb structure, and/or from a vibrating member in a magnetic field. In further embodiments, power source 140 includes a thermo-electric system that uses a radiant heat source, such as tritium, to heat a thermoelectric converter (i.e., a thermal-to-electric converter).

According to aspects of the invention, integrated circuit 100 includes more than one type of power source 140, each of which is fabricated on a different power generation die using integrated circuit fabrication process best suited for the type of power source (in terms, e.g., performance, cost, yield, robustness, etc.). For example, a photovoltaic power source may be fabricated on a topmost power generation die of integrated circuit 100 using a different process than a MEMS power source fabricated on a lower power generation die.

In accordance with aspects of the invention, power storage and control die 120 stores, manages, and/or routes power received from power generation die 110. In embodiments, power storage and control die 120 includes a power control circuit 150 and one or more power storage devices 155a ... 155f (collectively referred to herein as "power storage devices 155"). Power control circuit 150 can be a logic device including hardware, software, or a combination thereof that determines whether to store power received from power source 140 (e.g., via interconnect 105a, conductor 103a, and interconnect 105b) or route it to the functional system die 130. For example, in embodiments, power control circuit 150 is a power management integrated circuit (i.e., a PMIC) component. Power storage devices 155 may be rechargeable devices that receive power from power source 150 and retain it for future use. In embodiments, power storage devices 155 can be supercapacitors, nanobatteries, or the like.

In accordance with aspects of the invention, functional system die 130 includes components 160a ... 160d (collectively referred to as "components 160") that provide the functionality of integrated circuit 100 using power generated by power generation die 110. For example, functional system die 130 may be a system-on-chip that detects an event and wirelessly transmits information about the event, wherein components 160a ... 160d are circuits that perform the functions of detecting, processing, and transmitting the information about the event. In an exemplary embodiment, component 160a may be a sensor circuit; component 160b may be an analog-to-digital (i.e., A/D) converter circuit; component 160c may be a data processor (e.g., a core and/or a state machine); and component 160d may be a wireless communication circuit. In this exemplary embodiment, sensor circuit 160a can measure an environmental condition (e.g., temperature, humidity, pressure, radiation, sound, vibration, motion, compounds) and output a corresponding analog signal (e.g., a voltage). A/D converter 160b circuit can convert the analog signal into a digital signal. Data processor 160c may analyze the signal by, for example, comparing it to pre-stored parameters. Based on the analysis, data processor 160c may provide information to communication circuit 160d, which may use a RF signal to transmit the data.

According to aspects of the invention, since different amounts of power may be generated by power source 140, power control circuit 150 manages the power of integrated circuit 100 such that components 160 of functional die 130 are provided with consistent amount of power at their required voltages. In embodiments, power control circuit 150 monitors the power being provided from power source 140 and/or available in power storage devices 155, and determines whether sufficient power is available to operate one or more components 160 of functional system die 130. For example, power control circuit 150 can include a processor or state machine that compares available power to one or more threshold values stored in a memory of power control circuit 150. If, based on the threshold value, power control circuit 150 determines that insufficient power is available from power source 140 and/or storage devices 155 to operate components 160 of functional system die 150, power control circuit 150 may cut (e.g., turn off or remove) power to some or all of components 160 and, instead, recharge storage devices 155. If, based on the threshold value, power control circuit 150 determines that sufficient power is available, power control circuit 150 can route (e.g., shunt) power from power source 140 and/or the power storage devices 155 to the functional system die 130.

In embodiments, power control circuit 150 provides a low-power state in which power control circuit 150 selectively cuts power to component 160 of functional system die 130 such that integrated circuit 100 operates using less than full power while storage devices 155 are recharged. For example, if the available power is too low (e.g., below a stored threshold value), power control circuit 150 can selectively stop routing power to particular component 160 of functional system die 150 by switching-off power supplied to conductors 103b ... 103e corresponding to those components. For example, functional system die 130 may progressively remove power from a transmitter circuit while continuing to power a sensor circuit. By operating in a lower power state, integrated circuit 100 can continuously monitor an environment using the sensor circuit while intermittently transmitting information when sufficient power is available to operate the transmitter circuit.

In accordance with aspects of the invention, components 160 may be connected to different ones of interconnects 105g-105j. For example, as shown in FIG. 1 each component 160a ... 160d is connected to an adjacent one of interconnects 105g ... 105j to minimize the length of the wiring. Further, by connecting components 160a ... 160d to respective interconnects 105g ... 105j, power control circuit 150 can selectively route power to each component individually by controlling power provided to each of connects 105g ... 105j via interconnects 105c ... 105f and conductors 103b ... 103e. Various arrangements and groupings of interconnects 105 and components 160 may be used to provide selectively controllable groups of components 160. Additionally or alternatively, power control circuit 150 may communicate commands to other dies (e.g., via conductors 103 and interconnects 105) that selectively activate and deactivate (e.g., turn on/off) components of the other dies.

Additionally, in accordance with aspects of the invention, dies 110, 120, and 130 include intra-layer wiring that interconnects components on each die. For example, intra-layer wire 170a on power storage and control die 120 carries power between power control circuit 150 and storage device 155a. Intra-layer wire 170b on functional system die 130 can also carry information between component 160a and component 160b. The intra-layer wiring may be, for example, included in a wiring layer of each die 110, 120, and 130. The intra-layer wiring may carry electrical power and/or information, as the case may be for the various components included in a particular die. In accordance with aspects of the invention, the length of inter-layer wires 170 is minimized between any two locations (e.g., interconnect 105g and component 160a) to avoid loss of power and reduce communication latency.

In accordance with aspects of the invention, one or more of dies 110, 120, 130 are manufactured using a different type of wafer, fabrication technology and/or technology node than the others. For example, wafers used to fabricate dies 110, 120, and/or 130 may have different substrates (e.g., bulk Si, SOI, GaN, InAs, etc.) with different diameters, orientations, and/or thickness. Additionally, fabrications technologies can include CMOS, BiCMOS, SOI-CMOS, SiGe BiCMOS, RF CMOS, RF SOI, HV CMOS, InP HBT and CMOS MEMS having different technology nodes (e.g., 22 nm, 45 nm, 90 nm, etc.). For example, power generation die 110 may use a 90 nm bulk Si process, power storage and control die 120 may use a 45 nm SOI process, and functional system die 130 may use a 22 nm SOI process. As such, the fabrication methods used for each die may be optimized (e.g., based on cost, yield, performance, and/or robustness) for the function performed by the particular die.

Figure 2:
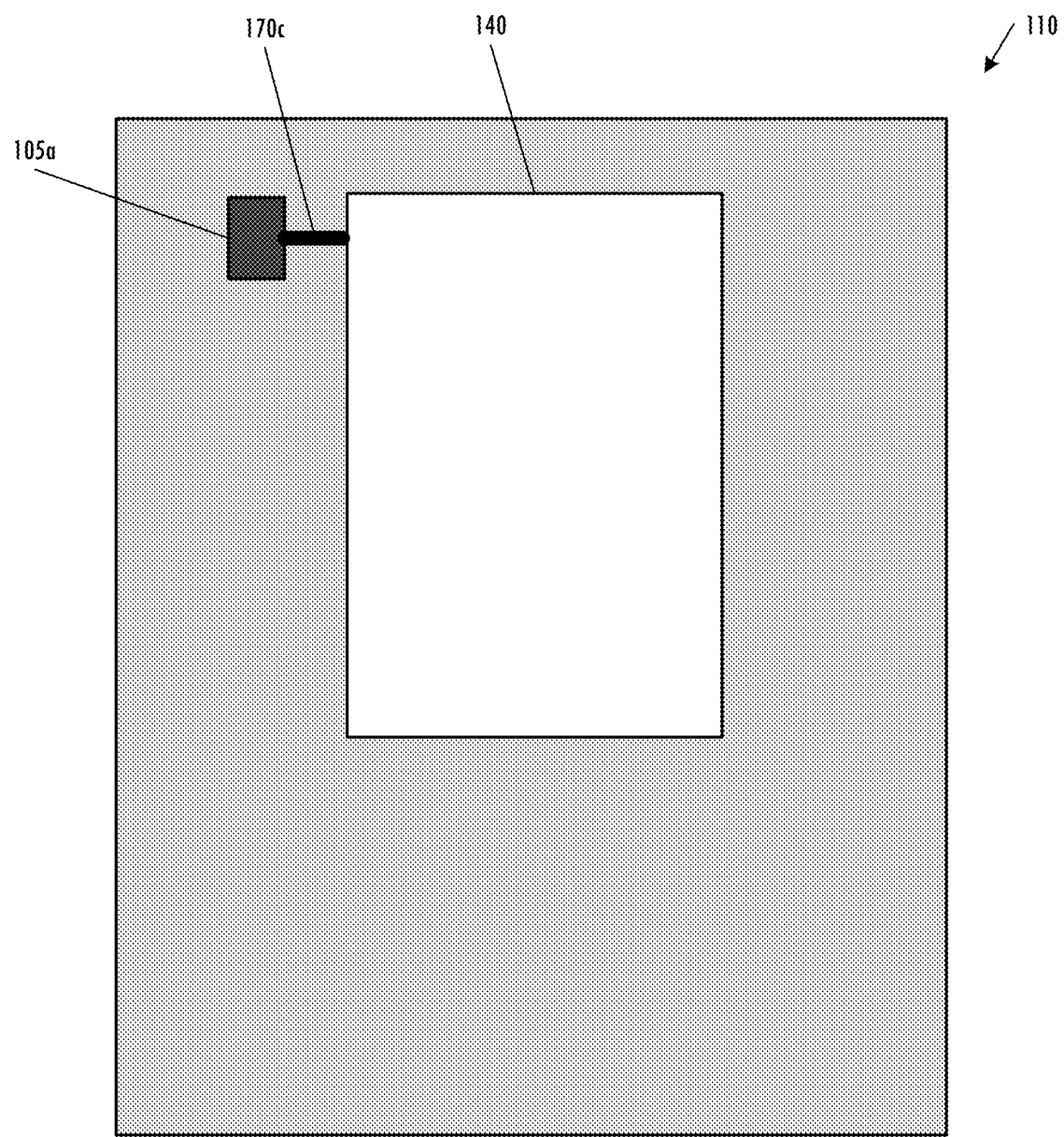
FIG. 2 shows an exemplary power generation die in accordance with aspects of the present invention.

FIG. 2 shows exemplary power generation die 110 in accordance with embodiments of the invention. Exemplary power generation die 110 includes interconnect 105a, power source 140, and intra-layer wire 170c. In accordance with aspects of the invention, interconnect 105a and power source 140 are selectively placed on power generation die 110 such that the total length of electrical paths (i.e., conductors and intra-layer wiring) that connect power generation die 110 with other dies stacked in an integrated circuit (e.g. integrated circuit 100) are minimized. Further, interconnect 105a may be a through-silicon via that contributes to the minimization of electrical path lengths within an integrated circuit (e.g., integrated circuit 100) by carrying power generated by power source 140 from an upper surface of power generation die 110 to a lower surface of power generation die 110 for distribution to other dies (e.g., power storage and control die 120 and functional system die 130).

In accordance with aspects of the invention, power source 140 generates power without a physical connection to a power supply device external to integrated circuit 100. In embodiments, power source 140 includes one or more of a MEMS power source, a thermo-electric source, a chemo-electric source, a photovoltaic source, or a radiant energy converter. Power generated by power source 140 is provided to other dies (e.g., power storage and control die 120 and functional system dies 130) via intra-layer wire 170c and interconnect 105a.

Figure 3:
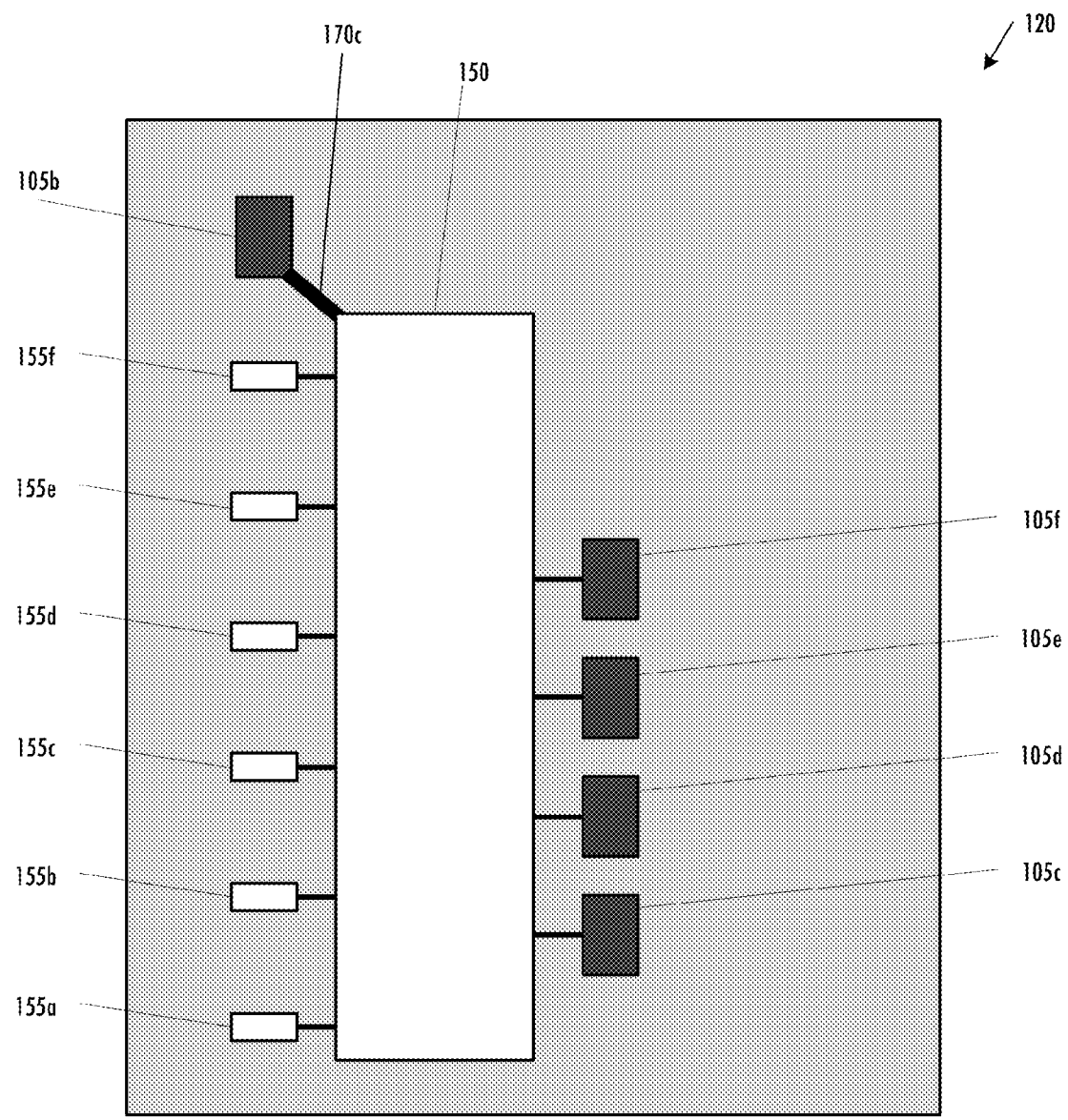
FIG. 3 shows an exemplary power storage and control die in accordance with aspects of the present invention.

FIG. 3 shows exemplary power storage and control die 120 in accordance with embodiments of the invention. Exemplary power storage and control die 120 includes interconnects 105b . . . 105f, power control circuit 150, and storage devices 155a . . . 155f. In accordance with aspects of the invention, interconnects 105b . . . 105f, power source 140, and storage devices 155a . . . 155f are selectively placed (e.g., by an electronic computer-aided design application) on power storage and control die 120 such that the total length of electrical paths in a stacked 3D integrated circuit (e.g., integrated circuit 100) are minimized. For example, the placement of interconnects 105b . . . 105f can be determined to align with corresponding interconnects 105 on other dies (e.g., power generation die 110 and functional system die 130) to minimize the length of conductors (e.g., conductors 103) interconnecting the dies. Additionally, power control circuit 150 and storage devices 155a . . . 155f can be placed in relation to interconnects 105b . . . 105f to minimize the length of intra-layer wiring (e.g., intra-layer wiring 170c). Further, interconnects 105c . . . 105f may be through-silicon vias that contribute to the minimization of electrical path lengths within a stacked 3D integrated circuit (e.g., integrated circuit 100) by carrying power routed by power control circuit 150 from an upper surface of power storage and control die 120 to a lower surface of this die for distribution to other dies (e.g., functional system die 130).

As described above with regard to FIG. 1, power control circuit 150 may include a logic device, such as a power management integrated circuit, that monitors power available from power source 140 and/or the power storage devices 155a . . . 155f and determines whether to route power to the functional system die 130 and/or store the power in storage devices 155a . . . 155f (e.g., supercapacitors). For example, when insufficient power is available in storage devices 155a . . . 155f to operate the components of another die (e.g., functional system die 130), power control circuit 150 may route power received from interconnect 105b and intra-layer wire 170c to power storage device 155f. When sufficient power is available, power control circuit 150 can route power received from interconnect 105b and/or from power storage devices 155 to one or more of interconnects 105c . . . 105f.

Figure 4:
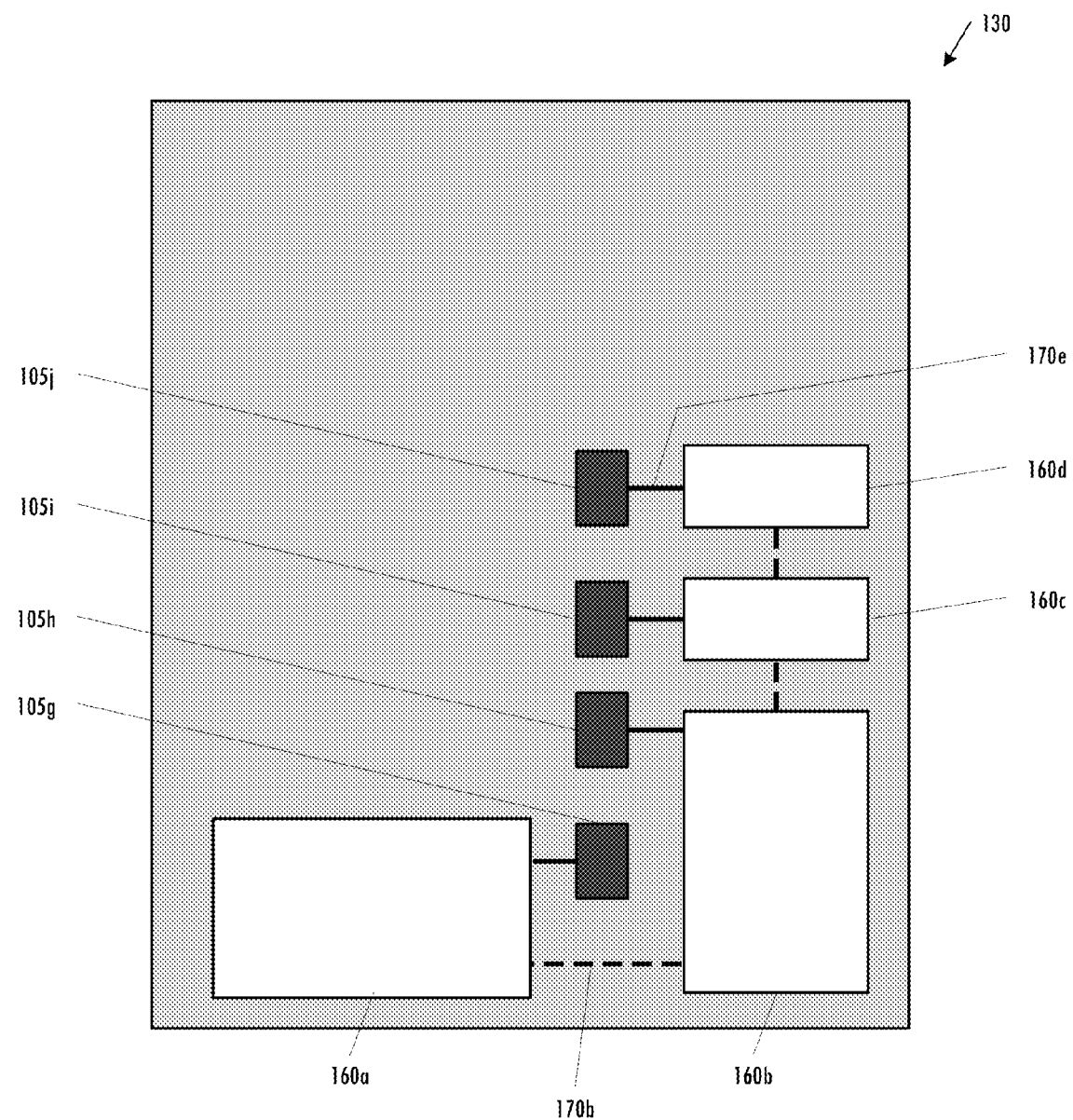
FIG. 4 shows an exemplary functional system die in accordance with aspects of the present invention.

FIG. 4 shows exemplary functional system die 130 in accordance with aspects of the invention. In embodiments, functional system die 130 includes interconnects 105g . . . 105j and functional components 160a . . . 160d. In accordance with aspects of the invention, functional system die 130 performs one or more functions (e.g., transmitting information of a sensed event) using power generated by power generation die 110 and provided via power storage and control die 120. For example, using power received via interconnects 105g . . . 105j, components 160a . . . 160d may generate, process, and/or transmit information.

In accordance with aspects of the invention, interconnects 105j . . . 105g and components 160a . . . 160d are selectively placed on functional system die 130 (e.g., by an electronic computer-aided design application) such that the total length of electrical paths that connect components 160a . . . 160d with other dies (e.g., power storage and control die 120) stacked in an integrated circuit (e.g. integrated circuit 100) are minimized. As shown in FIG. 4, components 160a . . . 160d are electrically connected by intra-layer wires, such as intra-layer wires 170b and 170e. More specifically, intra-layer wire 170b is a dashed line representing a communication link and intra-layer wire 170e is a sold line representing a power link. However, it should be understood that intra-layer wires 170 may carry information and/or power, as the case may be. In accordance with aspects of the invention, the length of intra-layer wires 170b and 170e are minimized to reduce communication latency and power loss.

In accordance with aspects of the invention, one or more of components 160a . . . 160d are connected to different interconnects 105g . . . 105j. For example, as shown in FIG. 4, each component 160a . . . 160d is located adjacent to a respective one of interconnects 105g . . . 105j. By doing so, the length of the wiring between components 160a . . . 160d and their power source is minimized. Further, by connecting components 160a . . . 160d to respective interconnects 105g . . . 105j, power can be selectively reduced or cut off to each individual component 160 exclusive of other components. Other arrangements and groupings may be used to provide selective control groups of components.

FIG. 4 shows all functional components 160 on a single die. However, in embodiments of the invention, one or more function components 160 may be on one or more other dies manufactured using different types of wafers, technologies, and technology nodes. For example, component 160d may be a communication circuit manufactured on a die using HV CMOS process, whereas components 160a . . . 160c are manufactured on a separate die using CMOS process. By doing so, the cost and complexity of manufacturing may be reduced, and/or performance improved.

Figure 5:
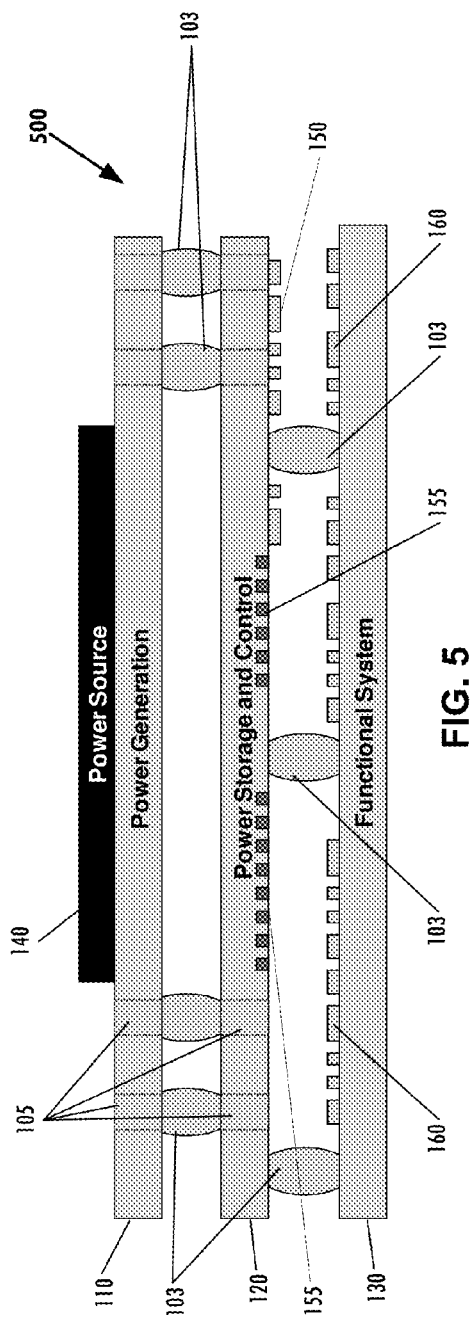
FIG. 5 shows an exemplary stacked 3D integrated circuit in accordance with aspects of the present invention.

FIG. 5 illustrates an exemplary stacked 3D integrated circuit 500 in accordance with aspects of the invention. Exemplary integrated circuit 500 can be the same or similar to integrated circuit 100. Integrated circuit 500 includes power generation die 110, power storage and control die 120, and functional system die 130 connected using an interconnect structure including conductors 103. According to aspects of the invention, dies 110, 120, and 130 include interconnects 105, which may be thru-silicon vias, electrically connecting the dies via conductors 103. Conductors 103 and interconnects 105 can carry power or information between dies 110, 120, and 130 depending on the distribution of components in a particular integrated circuit. Exemplary power generation die 110 includes power source 140 and interconnects 105. In embodiments, power source 140 can be one or more of a radiant energy power source, a chemo-electric power source, a thermo-electric power source, and a MicroElectro-Mechanical System (MEMS) power source. Exemplary power storage and control die 120 includes interconnects 105, power control circuit 150 and storage devices 155 (e.g., supercapacitors). Exemplary functional system die 130 includes functional components 160.

Figure 6:
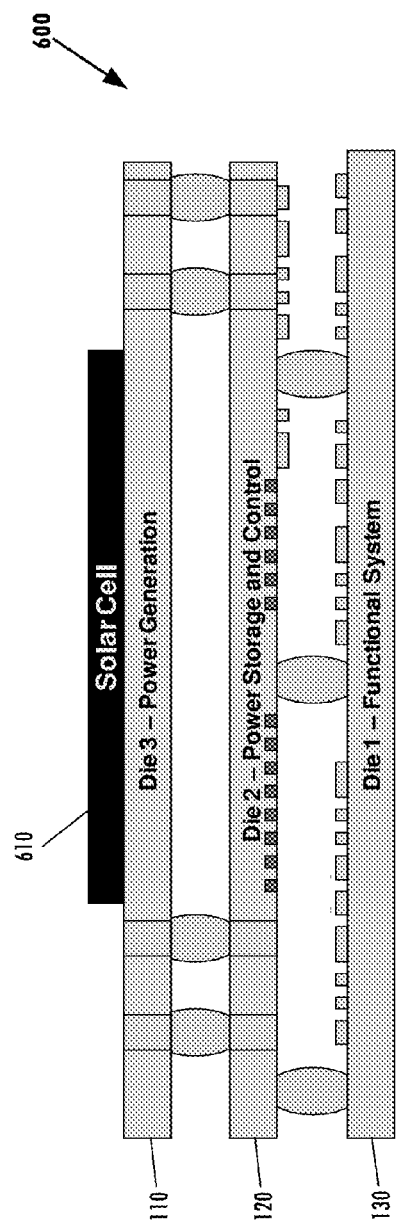
FIG. 6 shows an exemplary stacked 3D integrated circuit in accordance with aspects of the present invention.
Figure 7:
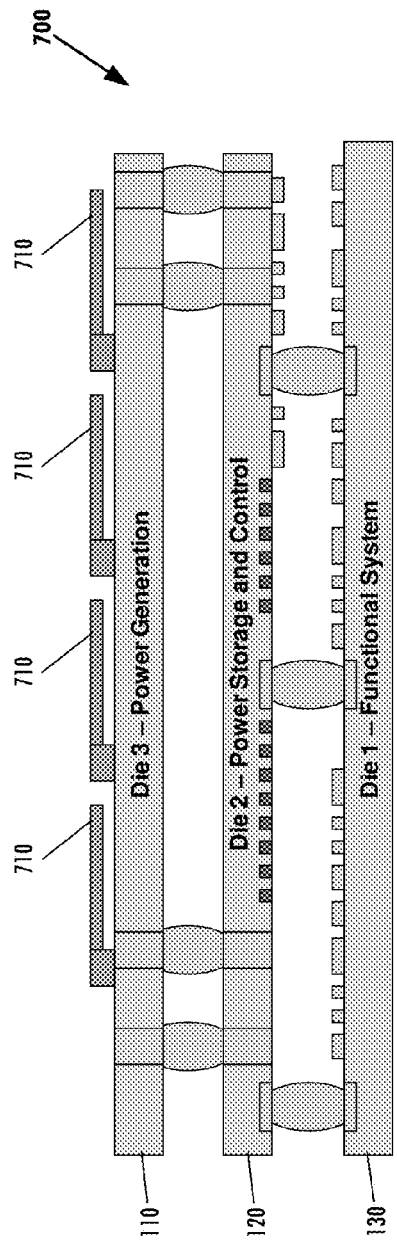
FIG. 7 shows an exemplary stacked 3D integrated circuit in accordance with aspects of the present invention.
Figure 8:
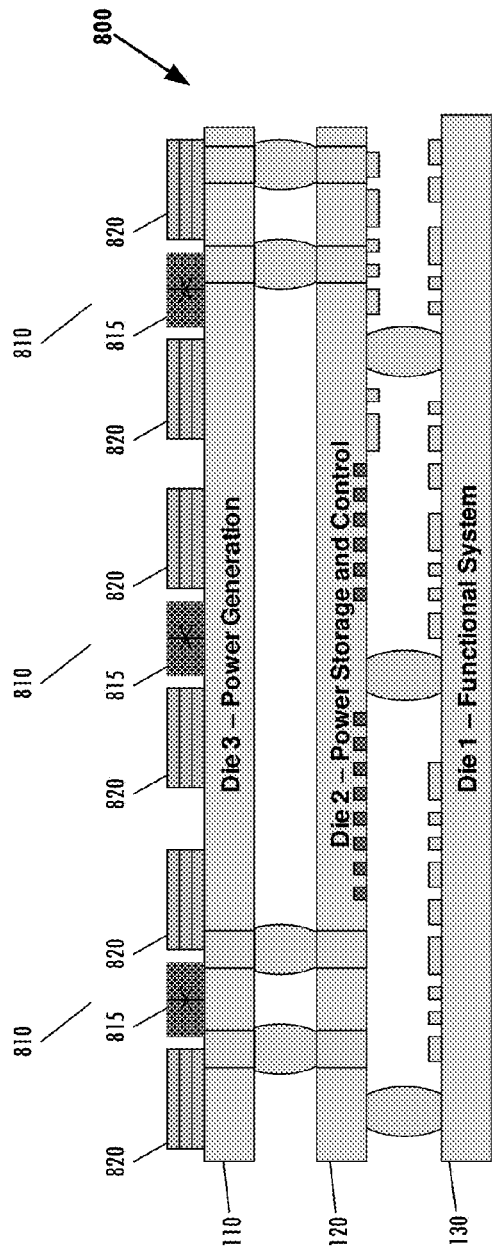
FIG. 8 shows an exemplary stacked 3D integrated circuit in accordance with aspects of the present invention.

FIG. 6 shows an exemplary integrated circuit 600 that is the same or similar to integrated circuit 500, wherein power source 140 is one or more solar cells 610. FIG. 7 shows an exemplary integrated circuit 700 that is the same or similar to integrated circuit 500, wherein power source 140 is one or more MEMS vibration power sources 710. FIG. 8 shows an exemplary integrated circuit 800 that is the same or similar to integrated circuit 500, wherein power source 140 is one or more thermo-electric power sources 810. In embodiments, the thermo-electric power sources include tritium sources 815 that generate heat by nuclear decay that is converted to electricity by and thermal-to-electric generators 820. In accordance with aspects of the invention, one or more of solar cells 610, MEMS vibration power sources 710, and thermo-electric power sources 810 is manufactured using different fabrication fabrications (e.g., type of wafer and/or technology node). The manufacture and operation of solar cells, MEMS, and thermo-electric power sources are understood by those of ordinary skill in the relevant art such that further explanation is not necessary.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable mediums having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 9:
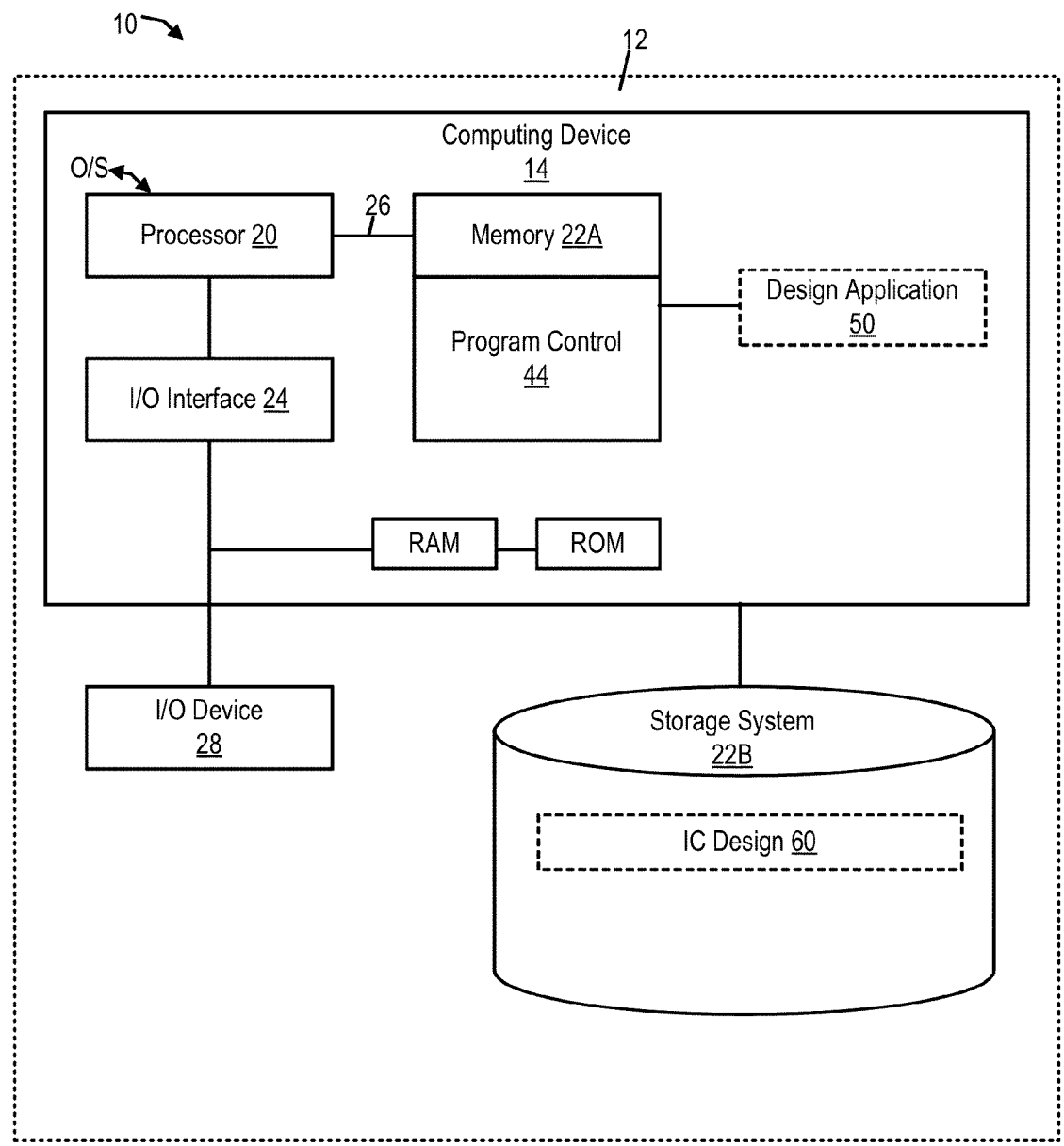
FIG. 9 shows an illustrative environment for implementing designs and steps in accordance with aspects of the invention.

FIG. 9 is an exemplary environment 10 for implementing the steps in accordance with aspects of the invention. To this extent, the environment 10 includes a server or other computing infrastructure 12 that can perform the processes described herein. In particular, the computer infrastructure 12 includes a computing device 14. The computing device 14 can be resident on a network infrastructure or computing device of a third party service provider (any of which is generally represented in FIG. 9).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with the external I/O device 28 and a storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard etc.

In general, the processor 20 executes computer program code (e.g., program control 44), which can be stored in the memory 22A and/or storage system 22B. Moreover, in accordance with aspects of the invention, the program control 44 controls a design application 50 to perform one or more of the processes described herein. Design application 50 can be implemented as one or more sets of program code in the program control 44 stored in memory 22A as separate or combined modules. Additionally, design application 50 may be implemented as separate dedicated processors or a single or several processors to provide the function of these tools.

While executing the computer program code, the processor 20 can read and/or write data to/from memory 22A, storage system 22B, and/or I/O interface 24. The program code executes the processes of the invention, for example, design application 50. Further, data read and/or write data to/from the memory 22A, storage system 22B and/or I/O interface 24 may include an IC design 60 that defines an stacked 3D integrated circuit (e.g., integrated circuit 100) including its elements included in dies, the placement of the elements on dies, and interrelationships between the elements and between the dies. Bus 26 provides a communication link between each of the components in computing device 14.

In accordance with aspects of the invention, design application 50 is computer program code stored in, for example, memory 22A and/or storage system 22B that, when executed by the processor 20, causes computing device 14 to determine and/or modify IC design 60. Design application 50 may include one or more software or hardware modules for designing, modeling and verifying IC designs using a hardware description language, such as VERILOG or VHDL. For instance, the design application 50 may be a synthesis/placement CAD tool that reads in design definitions (e.g., VHDL), physical area constraints, timing constraints, power constraints, design library information, synthesis rules, and operating conditions. Using these various parameters, design application 50 may determine a layout for elements in an IC design. The determined layout and associated information may be stored by computing device 14 in storage system 22B as IC design 60.

The computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, computing infrastructure 12 is only illustrative of various types of computer infrastructures for implementing the invention. For example, in embodiments, computing infrastructure 12 comprises two or more computing devices (e.g., a server cluster) that communicate over any type of communications link, such as a network, a shared memory, or the like, to perform the process described herein. Further, while performing the processes described herein, one or more computing devices on computing infrastructure 12 can communicate with one or more other computing devices external to computing infrastructure 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 10:
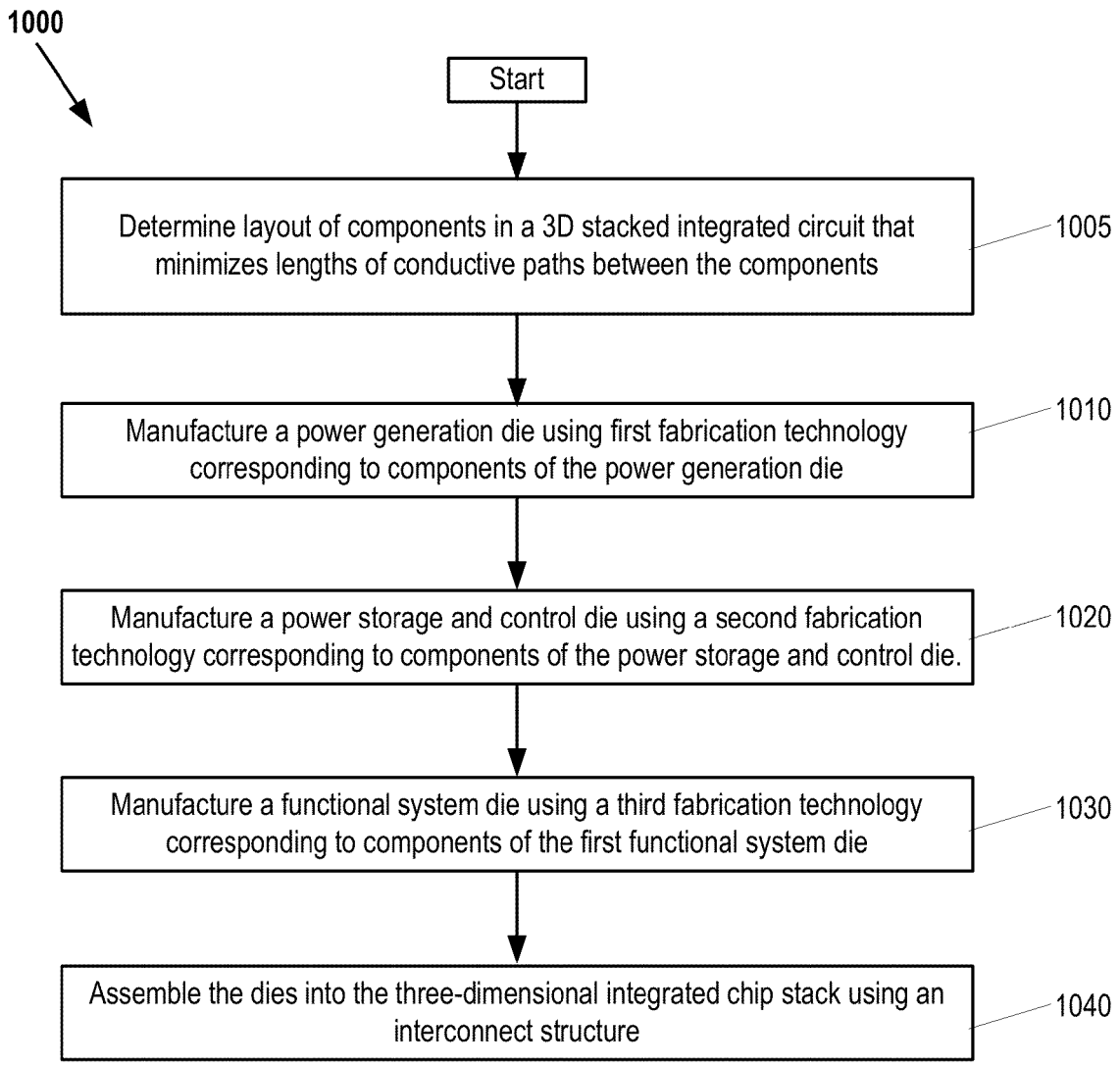
FIG. 10 shows a flow diagram of an exemplary process for providing a stacked 3D integrated circuit in accordance with aspects of the present invention.
Figure 11:
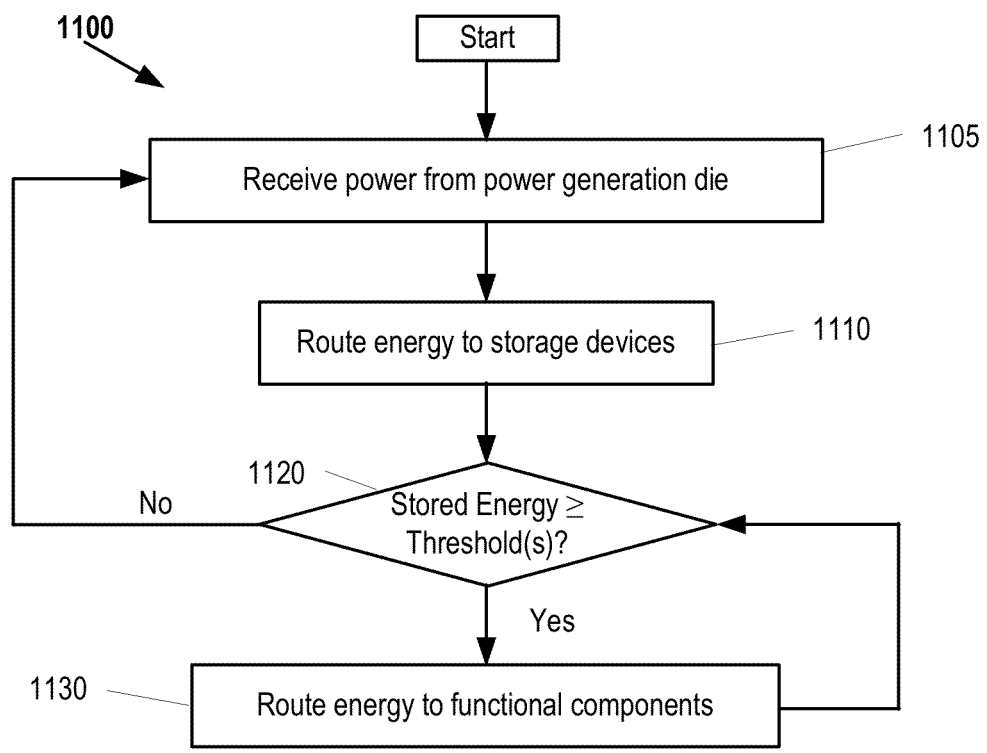
FIG. 11 shows a flow diagram of an exemplary process for routing power in a stacked 3D integrated circuit in accordance with aspects of the present invention.
Figure 12:
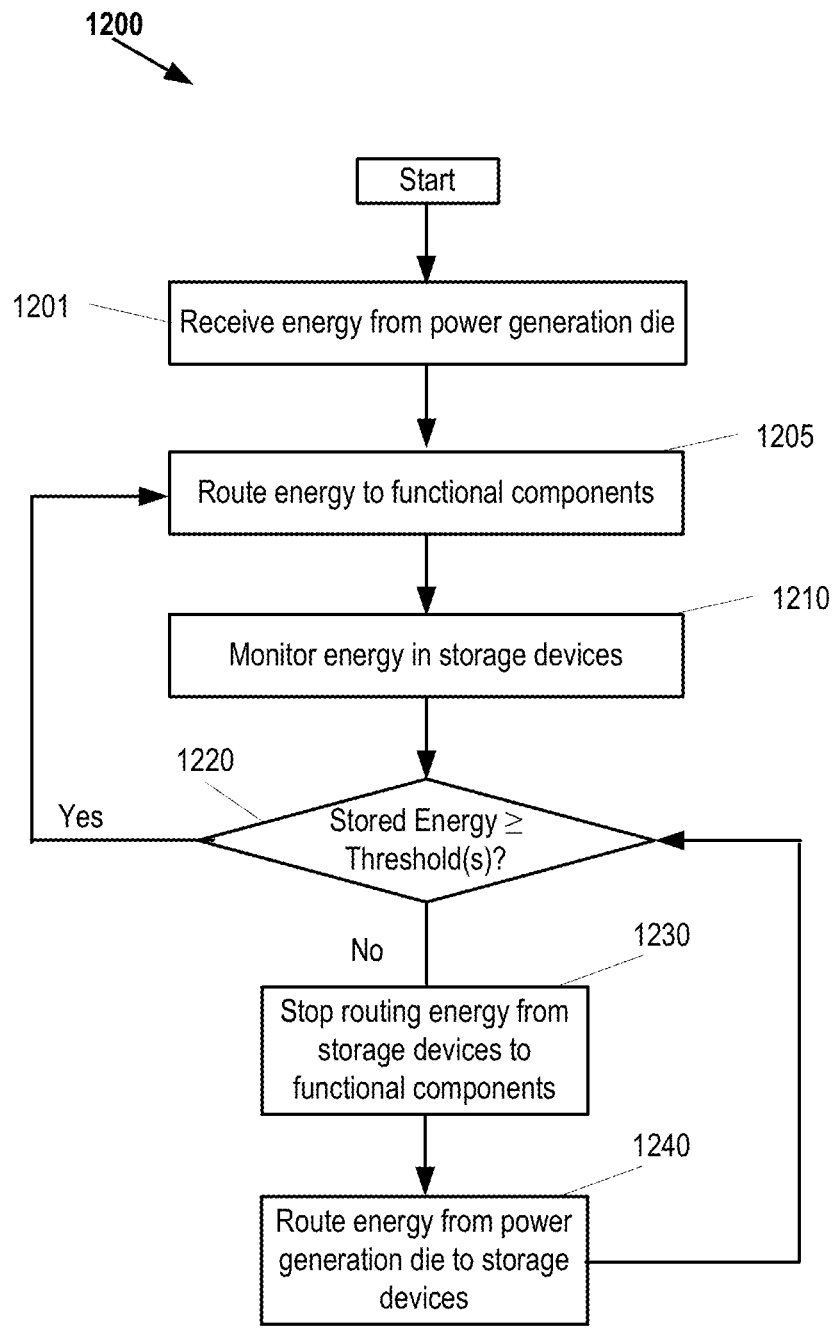
FIG. 12 shows a flow diagram of an exemplary process for routing power in a stacked 3D integrated circuit in accordance with aspects of the present invention.

FIGS. 10-12 show exemplary flows for performing aspects of the present invention. The steps of FIGS. 10-12 may be implemented in designing, manufacturing, and/or using the integrated circuits of FIGS. 1-8.

The flowcharts in FIGS. 10-12 illustrate the architecture, functionality, and operation of possible implementations of systems, methods, and computer program products according to various embodiments of the present invention. In this regard, each block in the flowchart or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIG. 10 depicts an exemplary process flow 1000 for manufacturing a stacked 3D integrated circuit in accordance with aspects of the invention. At step 1005, an automated software system (e.g., design application 50) and/or a designer determines a layout of components (e.g., IC design 60) in a stacked 3D integrated circuit (e.g., integrated circuit 100) that minimizes lengths of conductive paths between all the components of the stacked 3D integrated circuit. In embodiments, the layout is a functional representation of the physical structure of the stacked 3D integrated circuit.

At step 1010, a power generation die is manufactured based on the determined layout. The power generation die may be, for example, the same or similar to power generation die 110. In accordance with aspects of the invention, power generation die 110 is manufactured using a first fabrication technology corresponding to types and/or requirements components of the power generation die.

At step 1020, a power storage and control die is manufactured based on the determined layout. The power storage and control die may be, for example, the same or similar to power storage and control die 120. In accordance with aspects of the invention, power generation die is manufactured using a second fabrication technology corresponding to types and/or requirements components of the power storage and control die.

At step 1030, a functional system die is manufactured based on the determined layout. The functional system die may include, for example, the same or similar components as functional system die 130. In accordance with aspects of the invention, the functional system die is manufactured using a third fabrication technology corresponding to types and/or requirements components of the functional system die.

In accordance with aspects of the invention, at least one of the first, second, and third fabrication technologies used to fabricate the dies is different than the others. For example, a power generation die having a MEMS power source may be fabricated using a technology optimal for producing MEMS devices. Such a fabrication technology may not be well-suited for fabricating other components employed in the stacked 3D integrated circuit (a processing core or a miniaturized transceiver). Thus, such components may be fabricated on other dies of the stacked 3D integrated circuit using other technologies.

At step 1040, the power generation die, the power storage and control die, and the functional system die are assembled into a 3D chip stack using an interconnect structure (e.g., conductors 103). For example, the dies may be combined using a flip chip process that forms the interconnect structure between the dies and electrically links the respective components of the dies.

FIG. 11 depicts an exemplary process flow 1100 for routing power in a stacked 3D integrated circuit in accordance with aspects of the invention. At step 1105, a stacked 3D integrated circuit (e.g., integrated circuit 100) is inactive and a power control device (e.g., power control circuit 150) on a power storage and control die (e.g., power storage and control die 120) receives power from a power source (e.g., power source 140) on a power generation die (e.g., power generation die 110). At step 1110, the power control device routes power to storage devices (e.g. storage devices 155). At step 1120, the power control device determines whether power stored in the storage devices is greater than or equal to a predetermined threshold (e.g., 2 volts). If the stored power is not greater than the predetermined threshold, at step 1130, the process iteratively returns to step 1105 and continues to route the received power to the one or more of the storage devices. Otherwise, if the stored power is greater than or equal to the predetermined threshold, at step 1140, the power control circuit routes power to functional components (e.g., components 160) on a functional die (e.g., functional system die 130) and iteratively returns to step 1120.

In embodiments, there is a single predetermined threshold that the power control device references at step 1120 to determine whether to route the power to the storage devices or the functional components. In other embodiments, there are plural predetermined thresholds that the power control device references to progressively route power between the storage devices and the functional components. In accordance with aspects of the invention, the power control device may implement a "wake-up mode," in which power is progressively provided to the some of the functional components in a predetermined rate and/or order. For example, the power control circuit may first power a sensor and a processor to log data when stored power is at a first threshold and, subsequently, power a communication device when stored power is above a second threshold. By doing so, the stacked 3D integrated circuit can conserve power while monitoring an environment, and occasionally transmit stored information about the environment when sufficient power is available.

FIG. 12 depicts an exemplary process flow 1200 for routing power in a stacked 3D integrated circuit in accordance with aspects of the invention. At step 1201, a stacked 3D integrated circuit (e.g., integrated circuit 100) is active and a power control device (e.g., power control circuit 150) on a power storage and control die (e.g., power storage and control die 120) receives power from a power source (e.g., power source 140) on a power generation die (e.g., power generation die 110). At step 1205, the power control device routes power from power storage devices (e.g., power storage devices 155) on the power storage and control die and/or from the power source on power generation die to functional components (e.g., components 160) on a functional system die (e.g., functional system die 130). At step 1210, the power control device monitors the amount of power held in the storage devices. At step 1220, the power control device determines whether the amount of stored power is greater than or equal to a predetermined threshold value. If so, the process iteratively returns to step 1205 and continues to route power to the functional components. If at step 1220 the amount of stored power is less than the predetermined threshold value, then at step 1230, the power control device stops routing power from the storage devices to at least one of the functional components. At step 1240, the power control device routes power received from the power generation die to the storage devices and iteratively returns to step 1220.

In embodiments, there is a single predetermined threshold that the power control device references at step 1220 to determine whether to stop routing power to the functional components. In other embodiments, there is more than one predetermined threshold that the power control device references to progressively stop routing power to the functional components. In accordance with aspects of the invention, the power control device may implement a "sleep mode," in which power is progressively stopped to the some of the functional components in a predetermined rate and/or order. For example, the power control circuit may first stop powering communication devices when stored power falls below a first threshold and, only stop powering a sensor and processor after power falls below a second threshold. By doing so, a stacked 3D integrated circuit can conserve power while monitoring an environment while expending power to power communications when sufficient power is available.

Figure 13:
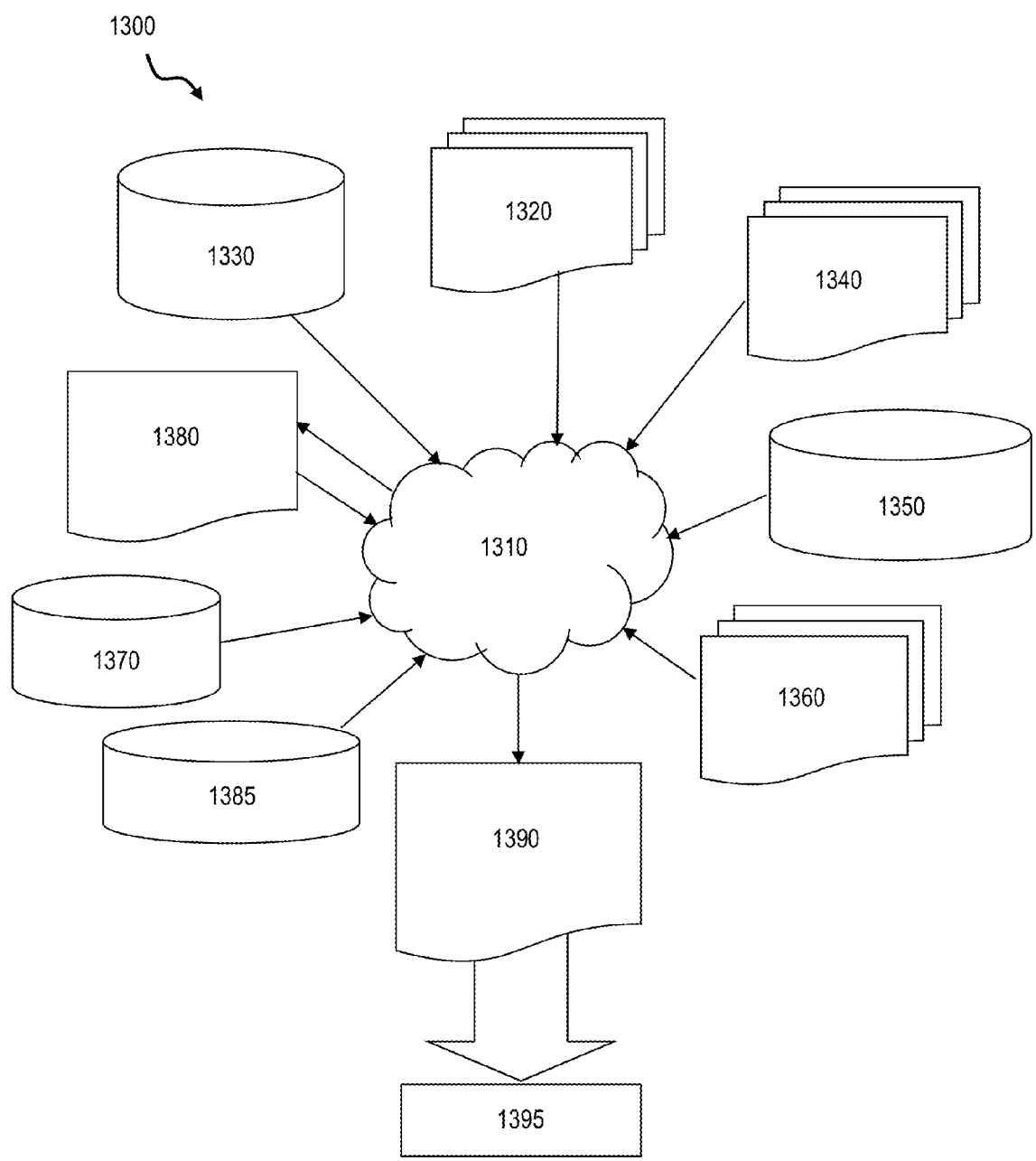
FIG. 13 is a flow diagram of a design process used in semiconductor design, manufacture, and/or test.

FIG. 13 is a flow diagram of a design process used in semiconductor design, manufacture, and/or test. FIG. 13 shows a block diagram of an exemplary design flow 1300 used for example, in semiconductor IC logic design, simulation, test, layout, and manufacture. Design flow 1300 includes processes, machines and/or mechanisms for processing design structures or devices to generate logically or otherwise functionally equivalent representations of the design structures and/or devices described above and shown in FIGS. 1-8. The design structures processed and/or generated by design flow 1300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1300 may vary depending on the type of representation being designed. For example, a design flow 1300 for building an application specific IC (ASIC) may differ from a design flow 1300 for designing a standard component or from a design flow 1300 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 1320 that is preferably processed by a design process 1310. Design structure 1320 may be a logical simulation design structure generated and processed by design process 1310 to produce a logically equivalent functional representation of a hardware device. Design structure 1320 may also or alternatively comprise data and/or program instructions that when processed by design process 1310, generate a functional representation of the physical structure of a hardware device. Whether representing functional and/or structural design features, design structure 1320 may be generated using electronic computer-aided design (ECAD) such as implemented by a core developer/designer. When encoded on a machine-readable data transmission, gate array, or storage medium, design structure 1320 may be accessed and processed by one or more hardware and/or software modules within design process 1310 to simulate or otherwise functionally represent an electronic component, circuit, electronic or logic module, apparatus, device, or system such as those shown in FIGS. 1-8. As such, design structure 1320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1310 preferably employs and incorporates hardware and/or software modules for synthesizing, translating, or otherwise processing a design/simulation functional equivalent of the components, circuits, devices, or logic structures shown in FIGS. 1-8 to generate a netlist 1380 which may contain design structures such as design structure 1320. Netlist 1380 may comprise, for example, compiled or otherwise processed data structures representing a list of wires, discrete components, logic gates, control circuits, I/O devices, models, etc. that describes the connections to other elements and circuits in an integrated circuit design. Netlist 1380 may be synthesized using an iterative process in which netlist 1380 is resynthesized one or more times depending on design specifications and parameters for the device. As with other design structure types described herein, netlist 1380 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1310 may include hardware and software modules for processing a variety of input data structure types including netlist 1380. Such data structure types may reside, for example, within library elements 1330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1340, characterization data 1350, verification data 1360, design rules 1370, and test data files 1385 which may include input test patterns, output test results, and other testing information. Design process 1310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1310 without deviating from the scope and spirit of the invention. Design process 1310 may also include modules for performing standard circuit design processes such as timing analysis, verification, design rule checking, place and route operations, etc.

Design process 1310 employs and incorporates logic and physical design tools such as HDL compilers and simulation model build tools to process design structure 1320 together with some or all of the depicted supporting data structures along with any additional mechanical design or data (if applicable), to generate a second design structure 1390.

Design structure 1390 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 1320, design structure 1390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 1390 may comprise a compiled, executable HDL simulation model that functionally simulates the devices shown in FIGS. 1-8.

Design structure 1390 may also employ a data format used for the exchange of layout data of integrated circuits and/or symbolic data format (e.g. information stored in a GDSII (GDS2), GL1, OASIS, map files, or any other suitable format for storing such design data structures). Design structure 1390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 1390 may then proceed to a stage 1395 where, for example, design structure 1390: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A stacked three-dimensional integrated circuit, comprising:
   a power generation die including a power source;
   a power storage and control die including a power controller and one or more storage devices that store power received from the power source; and
   a functional system die including one or more functional components that are powered by power generated by the power source,
   wherein the power generation die and the functional system die are stacked in a three-dimensional structure.

2. The integrated circuit of claim 1, wherein:
   the power generation die is stacked on the power storage and control die; and
   the power storage and control die is stacked on the functional system die.

3. The integrated circuit of claim 1, wherein at least two of the power generation die, the power storage and control die, and the functional system die are different fabrication technologies.

4. The integrated circuit of claim 3, wherein the different fabrication technologies include different types of wafers.

5. The integrated circuit of claim 3, wherein the different fabrication technologies include different technology nodes.

6. The integrated circuit of claim 1, further comprising an interconnect structure that electrically and mechanically connects the power generation die and the functional system die.

7. The integrated circuit of claim 6, wherein the interconnect structure comprises a through-silicon via connecting an upper surface of the power generation die to an upper surface of the functional system die through one or more conductors.

8. The integrated circuit of claim 1, wherein the power source is an energy harvesting system.

9. The integrated circuit of claim 8, wherein the energy harvesting system is one or more of: a radiant energy power source, chemo-electric power source, a thermo-electric power source, and a MicroElectro-Mechanical System (MEMS) power source.

10. The integrated circuit of claim 1, wherein the one or more functional components include a sensor, a processor, and a transmitter.

* * * * *